(12) United States Patent
Parent

(10) Patent No.: US 6,676,810 B2
(45) Date of Patent: Jan. 13, 2004

(54) METHOD OF COATING INSULATIVE SUBSTRATES

(75) Inventor: Donald G. Parent, Windham, ME (US)

(73) Assignee: D2 In-Line Solutions, LLC, Gray, ME (US)

( * ) Notice: Subject to any disclaimer, the term of this patent is extended or adjusted under 35 U.S.C. 154(b) by 203 days.

(21) Appl. No.: 09/758,848

(22) Filed: Jan. 11, 2001

(65) Prior Publication Data

US 2001/0023820 A1 Sep. 27, 2001

Related U.S. Application Data

(60) Provisional application No. 60/175,668, filed on Jan. 12, 2000.

(51) Int. Cl.$^7$ ............................................... C23C 14/22
(52) U.S. Cl. ................................................... 204/192.1
(58) Field of Search ....................................... 204/192.1

(56) References Cited

U.S. PATENT DOCUMENTS

| 4,028,206 | A | | 6/1977 | King | |
|---|---|---|---|---|---|
| 4,826,707 | A | * | 5/1989 | Schwarz et al. | 427/177 |
| 5,272,108 | A | * | 12/1993 | Kozawa | 437/127 |
| 5,525,369 | A | | 6/1996 | Blackwell et al. | |
| 5,691,008 | A | * | 11/1997 | Thoma et al. | 427/531 |
| 5,759,616 | A | | 6/1998 | Michel et al. | |
| 6,017,144 | A | * | 1/2000 | Guo et al. | 364/468.28 |
| 6,114,216 | A | * | 9/2000 | Yieh et al. | 438/424 |
| 6,123,986 | A | | 9/2000 | Maschwitz et al. | |
| 6,407,012 | B1 | * | 6/2002 | Miyasaka et al. | 438/788 |

* cited by examiner

*Primary Examiner*—Bret Chen
(74) *Attorney, Agent, or Firm*—Iandiorio & Teska

(57) ABSTRACT

A method of applying a coating to an insulative substrate. The method includes applying a coating material to the insulative substrate by physical vapor deposition to a predetermined thickness at a rate and for a predetermined time which does not cause thermal damage to the insulative substrate. Then, before thermal damage can occur, moving the partially coated substrate proximate an active cooling station device to drive the temperature of the insulative substrate substantially down. The deposition and cooling steps are then repeated until the desired coating thickness is obtained to avoid thermal damage to the substrate.

21 Claims, 6 Drawing Sheets

METHOD OF COATING INSULATIVE SUBSTRATES

PRIORITY CLAIM

This invention claims priority from Provisional Application Ser. No. 60/175,668 filed Jan. 12, 2000.

FIELD OF THE INVENTION

This invention relates to processes and subsystems for coating thin plastic substrates with thick metallic layers.

BACKGROUND OF THE INVENTION

When a metallic coating material is applied to a component or substrate, heat is generated. For substances not susceptible to thermal damage, the deposition rate is not usually a factor. And, for insulative plastic parts, if the coating is applied only as a very thin layer, thermal damage will not occur because the dwell time is short.

To place a thick (e.g., 2–4 micron) metallic layer, on a thin (e.g., 1–4 mm thick) plastic substrate, however, the dwell time is long enough for the heat generated during this process to cause thermal damage to the plastic part and/or cause it to become brittle.

Sputtered coatings are applied to highly insulative plastic parts for various reasons. Dielectric coatings are applied to modify surface properties such as hardness, environmental susceptibility, and optical transmission. Metal coatings are applied for optical reflectance, EMI/RFI attenuation, and optical transmission. Other coatings and applications exist which are not specifically outlined here, but which may also be applied through sputtering. In one example, the inside of a cellular telephone housing is metalized for shielding purposes. In another example, plastic eyeglass lenses are coated with an anti-reflective and/or protective (anti-scratch) coatings.

Present methods of coating plastic parts with metal are electroplating, electroless plating, painting, arc-spray, evaporative vacuum metalization, and sputter vacuum metalization. These processes are usually batch oriented and require a large production run volume to be cost effective. Batch processes result in large work in process inventories (WIP) and logistical complications in scheduling and part management. In-line sputtering systems (as is common in optical disc manufacturing) eliminate issues such as long cycle times and high WIP, however, they require short sputtering cycles to properly interconnect with other production processes.

Rapid deposition of thick sputtered coatings, however, is limited by part overheating as explained above. Generally, as the sputtered coated thickness increases, heat is deposited into the underlying substrate. Since sputtering occurs in a vacuum, the primary modes of heat transfer (conduction and convection) are substantially reduced because there is little gas available to transport heat to the surroundings. Radiation heat transfer provides little benefit since radiation heat fluxes are well below the heat flux imposed on the part from the incoming sputtered film.

Because of this limitation, sputter coating of thick layers requires long deposition times and low deposition rates to prevent part overheating because the incoming heat flux from the sputtered layer must be reduced to a level where part overheating does not occur.

Production engineers realize that the coating must be applied to the part quickly to meet the demands of the production cycle but also realize that thermal damage can then occur due to overheating. So, they continuously walk a fine line between speed and thermal damage. Often, however, the line is crossed resulting in defective parts, and the shutdown of the production facility to troubleshoot the system. In the case of cellular telephone housings, 5,000 parts are often treated at once in a large vacuum chamber. If the parts overheat, the result is a waste of money and time. On the other hand, if the dwell time is slowed down to prevent overheating, not only are the demands of the production cycle not met but contamination of the parts can occur when, because of imperfect vacuum conditions, contaminants enter the vacuum chamber and contaminate the parts.

It is known in the art of physical vapor deposition processes relating to coating aluminum magnetic discs with various coatings to lower the temperature of the magnetic discs in the vacuum chamber. Before chromium, cobalt alloys, or carbon layers can be applied to the aluminum disc, it must be cooled from 300° C. to 150° C. and cooling is effected by moving the aluminum disc between two planar heat sinks. Even by using cyrogenic heat sinks, this temperature reduction takes over a minute. See U.S. Pat. Nos. 5,287,914 and 5,181,556 incorporated herein by this reference.

Temperatures as high as 150° C. and dwell times as long as a minute, however, will cause thermal damage to insulative plastic parts. Therefore, unlike the art of cooling aluminum magnetic discs in which thermal damage is not a primary concern and instead cooling is effected only because some of the coating processes are temperature dependent, thermal damage and embrittlement are the primary focus in the art of coating relatively thin plastic components with thick metallic layers.

SUMMARY OF THE INVENTION

It is therefore an object of this invention to provide a method of applying a coating to an insulative substrate.

It is a further object of this invention to provide such a method which prevents thermal damage, embrittlement, product waste, and the troubleshooting required when plastic parts are completely coated at once with a metalization layer.

It is a further object of this invention to provide a method of rapidly and actively cooling plastic substrates between sputtering steps without affecting the quality of the overall coating.

It is a further object of this invention to provide such a method in which thermal damage is avoided and yet the overall process is still almost as fast as the prior art method when all parts were completely coated during only one coating step.

It is a further object of this invention to provide a system for applying a coating to an insulative component.

It is a further object of this invention to provide such a system which includes at least one active cooling station arranged to actively cool the insulative components and drive the temperature of the insulative components substantially down between sputtering steps to prevent thermal damage.

This invention results from the realization that the thermal damage, embrittlement, product waste, and troubleshooting required when plastic parts are completely coated at once with a metalization layer can be avoided by only partially coating the parts and, before thermal damage can occur, moving the parts to a cooling station where they are actively and quickly cooled and then repeating the coating and active cooling processes until the desired coating thickness is obtained. Thermal damage is avoided and yet the overall process is still faster than the prior art method when all the parts were completely coated during only one coating step.

This invention features a method of applying a coating to an insulative substrate comprising the application of a coating material to the insulative substrate by physical vapor deposition to a predetermined thickness at a rate and for a predetermined time which does not cause thermal damage to the insulative substrate. Then, before thermal damage can occur, the partially coated substrate is moved proximate an active cooling station device to drive the temperature of the insulative substrate substantially down. The coating and cooling steps are then repeated until the desired coating thickness is obtained to avoid thermal damage to the substrate.

The coating material is typically metal such as copper, aluminum and alloys of the same, and the same material is usually applied during all coating steps. The coating material may also be a polycrystalline substance. The typical substrate is plastic between 1–4 mm thick. Preferably, coating is applied to a total thickness N, there are X coating steps, and, at each coating step, a thickness of N/X is applied. In one example, N is between 2 to 4 microns and N/X is between ⅛ and ⅝ micron.

The insulative substrate may be the housing of an electronic device such as a cellular telephone. Another insulative substrate is a plastic lens.

Physical vapor deposition may include sputtering, cathodic arc deposition, and evaporation techniques. In the preferred embodiment, cooling includes placing the partially coated substrate proximate a heat sink and subjecting the partially coated substrate to a high conductivity gas such as helium. The heat sink is typically cooled by a liquid coolant.

Each coating step preferably lasts less than one minute and each cooling step also lasts less than one minute. To balance the system, the time span in which each partial layer of coating material is applied is the same or approximately the same time as the time span for each cooling step. Preferably, substrate temperature never exceeds between 60° C. and 90° C. The cooling step typically drives the temperature of the substrate from between 40–60° C. to between 5–20° C.

This invention also features a system for applying a coating to an insulative component. There is a vacuum chamber, at least one physical vapor deposition station arranged to apply a coating material to the insulative component, and at least one cooling station arranged to actively cool the insulative component and drive the temperature of the insulative component substantially down.

A component handler is designed to move the insulative component within the vacuum chamber and programmed to automatically bring the components proximate a physical vapor deposition station until the components are partially coated to a predetermined thickness and then proximate a cooling station before thermal damage can occur to the components and until they are sufficiently cooled and to then switch between physical vapor deposition stations and cooling stations until the desired coating thickness is obtained.

Typically, there are a plurality of physical vapor deposition stations and cooling stations arranged circumferentially with cooling stations positioned between physical vapor deposition stations. In another embodiment, there are a plurality of physical vapor deposition stations and cooling stations arranged linearly with cooling stations positioned between physical vapor deposition stations. Each cooling station may include a heat sink in a subchamber and means for filling the subchamber with a high conductivity gas. In one embodiment, the components included a cavity and the heat sink is then shaped to fit within the cavity. The programming of the component handler may include logic which limits the partial coating time to less than one minute and the cooling time to less than one minute and preferably the time span of partial cooling is the same as or approximately the time span of cooling. Typically, the component handler includes trays for holding a plurality of components, each cooling station includes one heat sink for each tray, and each cooling station further includes a subchamber containing all the heat sinks and means for filling the subchamber with a high conductivity gas.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
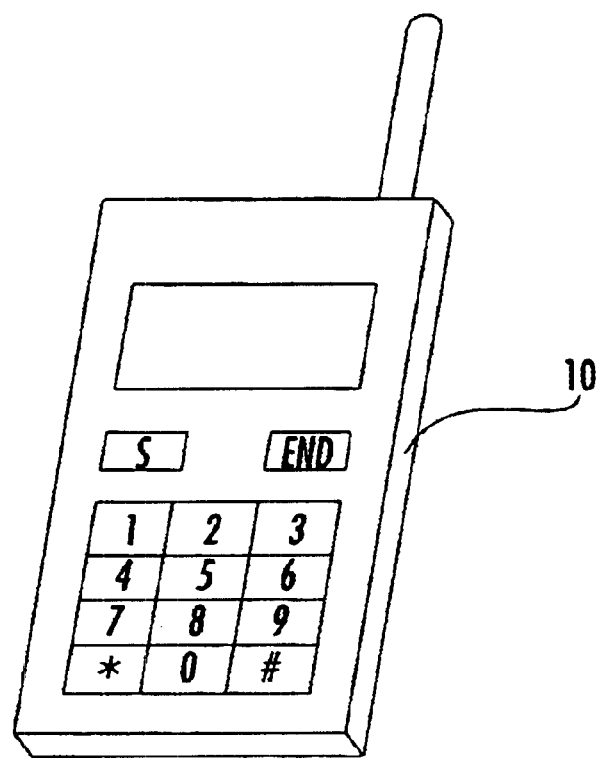
FIG. 1 is a schematic view of a cellular telephone, the housing of which may be coated with a metalization layer in accordance with the subject invention.
Figure 2:
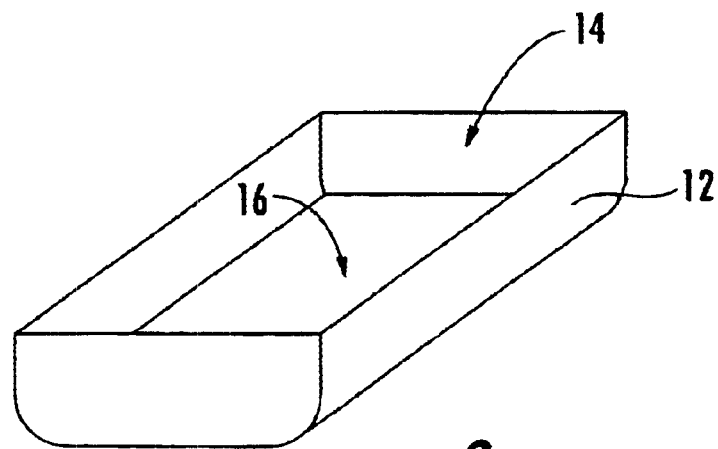
FIG. 2 is a schematic three dimensional view of a portion of the housing for the cellular telephone shown in FIG. 1.

As explained in the Background section above, thin plastic parts are often coated by physical vapor deposition techniques (e.g., sputtering, cathodic arc deposition, and evaporation), with a metalization layer. Thus, for example, cellular telephone 10, FIG. 1 housing 12, FIG. 2 includes cavity 14 defined by wall 16 which is coated with copper, aluminum, or alloys of the same for shielding purposes. In another example, plastic eyeglass lenses are coated with a polycrystalline substance which acts as a protective anti-scratch coating and/or anti-glare composition. In the prior art, as many as 5,000 housings are coated at once in a large vacuum chamber.

Production engineers realize that the coating must be applied to the part quickly to meet the demands of the production cycle but also realize that thermal damage can then occur due to overheating. So, they continuously walk a fine line between speed and thermal damage.

If the parts overheat, the result is a waste of money and time. On the other hand, if the dwell time is slowed down, not only are the demands of the production cycle not met but contamination of the parts can occur when, because of imperfect vacuum conditions, contaminants enter the vacuum chamber and contaminate the parts.

Figure 3:
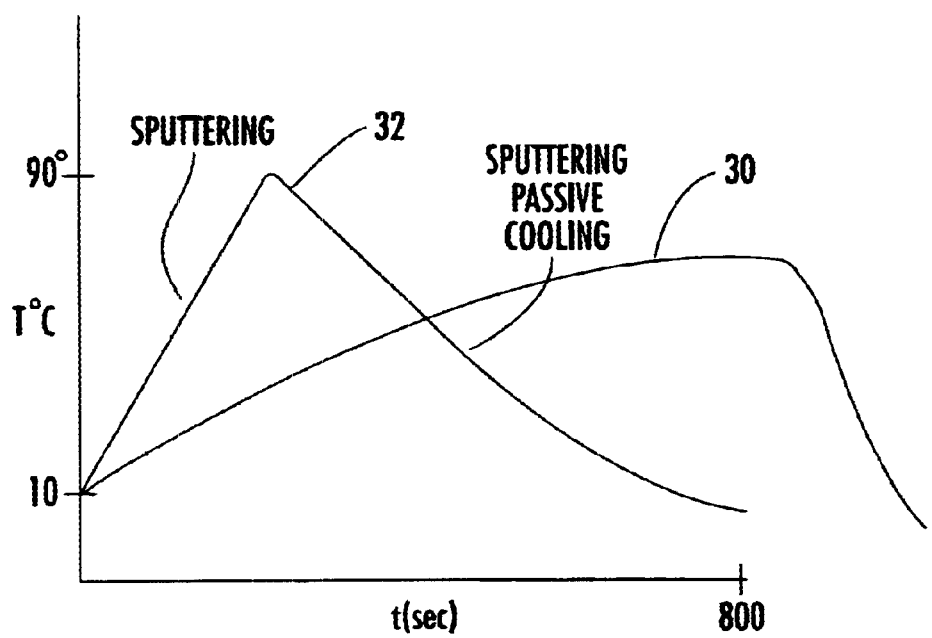
FIG. 3 is a graph showing the temperatures reached by sputtering operations used to coat the plastic housing shown in FIG. 2 and the time it would take to passively cool the plastic housing.

As shown in FIG. 3, at present, there are two ways of preventing thermal damage: a slow sputter rate as shown at 30 and to passively allow the substrate to cool between sputtering operations as shown at 32. Both of these techniques adversely effect the throughput and can result in contamination. In both cases, application of the coating to the substrate can take over an hour in order to prevent thermal defects.

In the subject invention, thermal damage is prevented and yet the throughput remains high.

Figure 4:
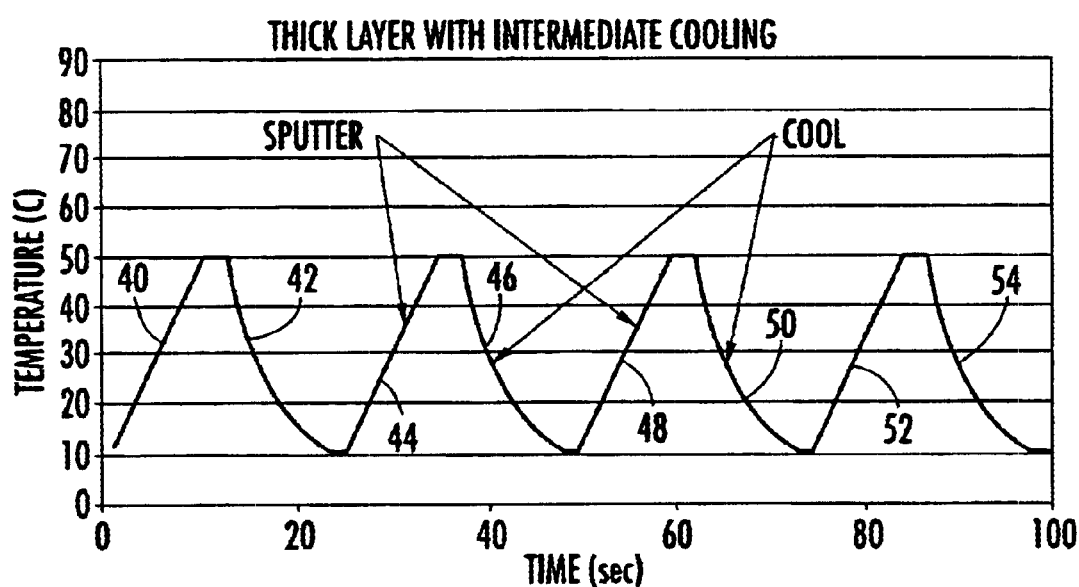
FIG. 4 is a graph showing the method of applying a coating to an insulative substrate in accordance with the subject invention wherein the substrate temperature never exceeds about 50° C. because numerous sputtering and active cooling steps are effected.

The method of applying a coating to an insulative substrate in accordance with this invention includes applying the coating material to the insulative substrate by physical vapor deposition to a predetermined thickness which does not cause thermal damage to the insulative substrate, step 40, FIG. 4. Then, before thermal damage can occur, the partially coated substrate is moved proximate an active cooling device or station to drive the temperature of the insulative substrate substantially down, step 42. Then, these steps are repeated typically by applying the same coating material until the desired coating thickness is obtained to avoid thermal damage to the substrate. As shown, steps 44, 48, and 52 are sputtering steps and steps 46, 50, and 54 are cooling steps. The usual coating material is metal such as copper, aluminum, and alloys of the same. Other coating materials include polycrystalline substances used in connection with plastic eyeglass frames.

The substrate is typically very thin, between 1–4 mm thick and thus susceptible to thermal damage. A coating is applied to a total thickness of N and there are X coating steps. Each coating step results in a coating thickness of N/X. In the example of a cellular telephone, the thickness N is between 2–4 microns and about ½ micron of material is deposited at each of steps 40, 44, 48, and 52. The value of N/X may range from between ⅛ and ⅝ of a micron. At each coating step, the same material may be applied or, alternatively, dissimilar metals may be applied resulting in a coating of alternating layers of aluminum and tin, for example.

Figure 5:
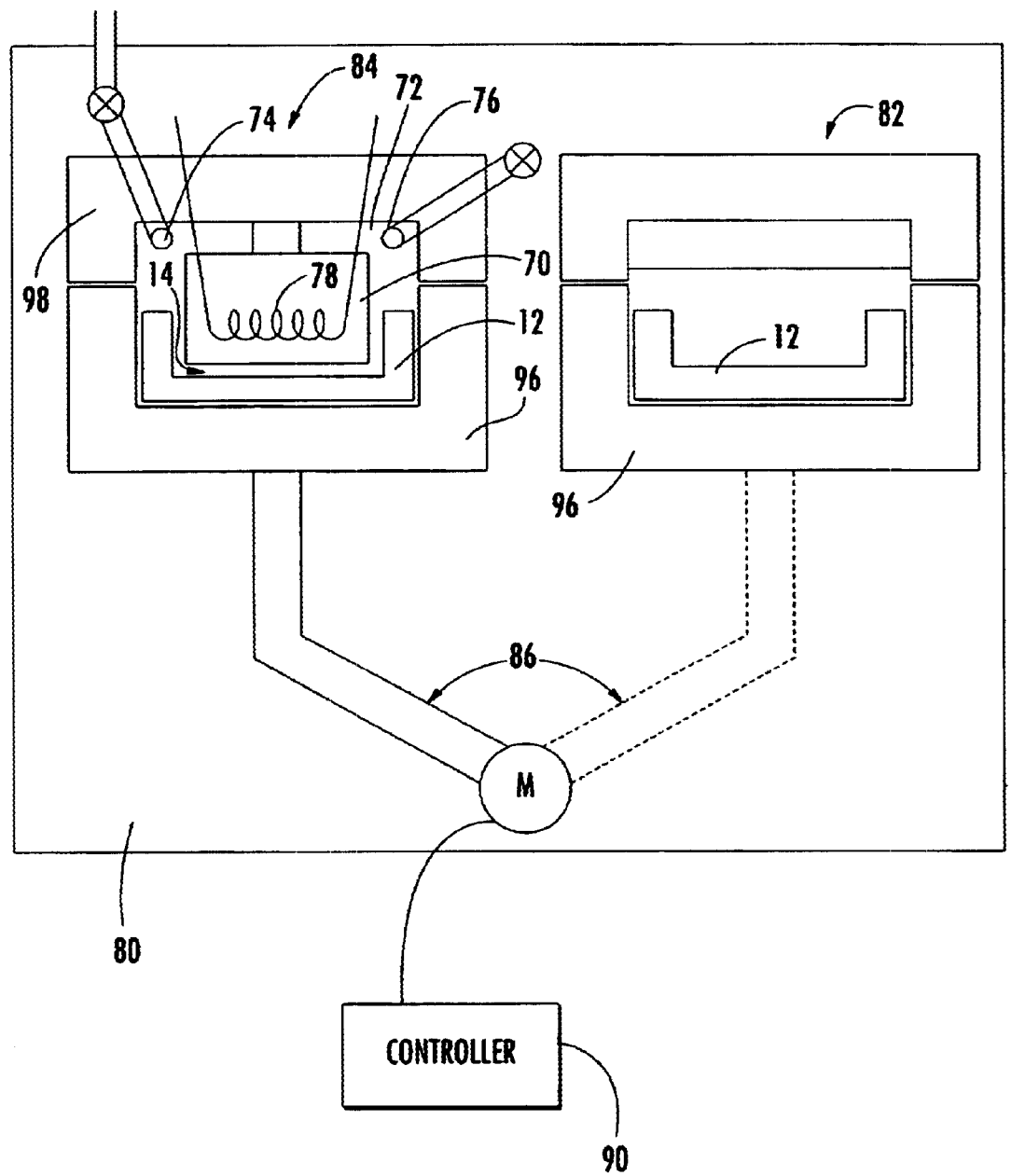
FIG. 5 is a schematic diagram showing the primary components associated with the system for applying a coating to an insulative component in accordance with the subject invention.

Active cooling steps 42, 46, 50, and 54 involve placing the partially coated substrate 12, FIG. 5 proximate heat sink 70 and subjecting the partially coated substrate to a high conductivity gas such as helium which enters subchamber 72 via inlet port 74 and exits subchamber 72 via outlet port 76. Heat sink 70 is cooled by a liquid coolant as depicted at 78 driven at $-50°$ C. Heat sink 70 is sized and shaped to fit within cavity 14 of housing 12 and typically brought to within 1 mm of the bottom back surface of the housing (16, FIG. 1). As shown in FIG. 4, each coating step lasts less than one minute and each cooling step also lasts less than one minute. Therefore, throughput is high because the dwell times are short. The time spent in which each partial layer of coating material is applied is preferably the same or approximately the same time span for each cooling step as shown in FIG. 4 resulting in a balance system and faster throughput.

The substrate temperature never exceeds 60° C. as shown to prevent thermal damage. Cooling steps 42, 46, 50, and 54 drive the temperature of the substrate from between 40–70° C. to between 5–20° C. The total dwell time is less than 100 seconds compared to the one hour dwell time associated with the prior art.

The system for applying a coating to an insulative component in accordance with this invention includes vacuum chamber 80, FIG. 5 and at least one physical vapor deposition station 82 arranged to apply a coating material to the insulative component. Component handler subsystem 86 includes tray 96 and is designed to move insulative component 12 within the vacuum chamber. Thus, controller 90 is programmed to bring the components first proximate physical vapor deposition station 82 (step 40, FIG. 4) until the components are partially coated to a predetermined thickness (e.g., ½ micron) and then proximate cooling station 84 (step 42, FIG. 4) before thermal damage can occur to the components and until they are sufficiently cooled. Cooling station 84 is arranged to actively cool the insulative components and drive their temperature substantially down as discussed above.

Component handler subsystem 86 then switches between physical vapor deposition station 82 and cooling station 84 until the desired coating thickness is obtained. Tray 96 of component handler subsystem 86 forms a portion of gas subchamber 72 along with structure 98. Typically, however, for volume production runs, the trays each hold many parts and there are a plurality of physical vapor deposition stations 100, 102, FIG. 6 and cooling stations 104, 106 arranged circumferentially with cooling stations 104 and 106 positioned between physical vapor deposition stations 100 and 102 as shown. Alternatively, station 106 is a loading and unloading station coupled to conveyor system 110. As shown, each station can simultaneously treat a number of parts 112, 114, 116, and 120. In another embodiment, FIG. 7, there are a plurality of physical vapor deposition stations 120, 122 and cooling station 124, 126 arranged linearly.

The programming associated with controller 90 includes logic which limits the partial coating time to less than one minute and the cooling time to also less than one minute as shown in FIG. 4 and preferably in which the time span of each partial coating step is the same as or approximately the same as the time span of each cooling step as discussed above. Each cooling station 124, 126 includes one heat sink 70 for each tray which, in turn, includes a single part. Subchamber 72 surrounds all the heat sinks.

Surprisingly, rapid and active cooling of the plastic substrates between the partial sputtering steps had no effect on the quality of the coating. Thus, in this invention, thicker coatings can be applied to thinner substrates faster and without causing thermal damage and without contamination.

In this invention, the sputter cycle is broken into pieces by applying thin layers in multiple steps to achieve the desired thickness. A cooling step is inserted between each of the sputter steps to cool the parts back to near ambient temperature prior to the onset of the next sputter step.

Figure 6:
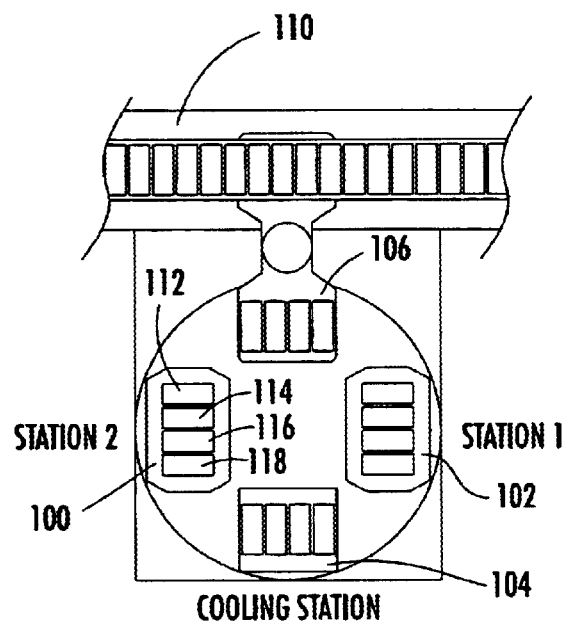
FIG. 6 is another schematic view showing the coating system of the subject invention wherein the individual cooling and coating stations are arranged in a circular fashion.

Parts are maintained in the vacuum system without exposure to the atmosphere throughout the entire process which prevents oxidation between layers. Thus, the application of thick, high quality layers at high production rates is achieved without part overheating. Currently available vacuum sputtering systems are not suitable for inline operation since the required sputter rates would lead to part overheating. In this invention, the limitations associated with the prior art systems are overcome by providing for part cooling after sputtering. The metalizer used typically consists of multiple magnetrons (cathodes) arranged around the periphery of a main vacuum chamber as shown in FIG. 6. Multiple cathodes are necessary to achieve a sufficient throughput to keep up with the upstream molding machine. Part cooling stations are located between each of the cathodes to cool the part to near ambient temperature after sputtering. In this way, parts can be sputtered and cooled in a continuous manner permitting the application of thick coatings without part overheating.

Figure 7:
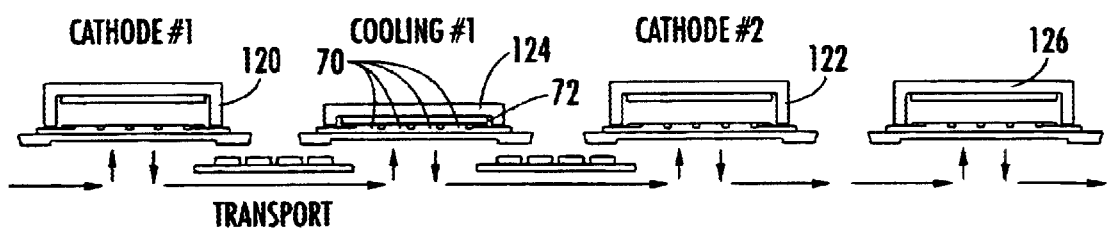
FIG. 7 is another schematic view of the system for applying a coating to an insulative component in accordance with the subject invention wherein the coating and cooling stations are linearly arranged.

The internal material handling subsystem moves the parts from a load lock to the first cathode, where they are sputtered at a time and power level that will apply a coating layer without overheating. In the next machine cycle, the internal component handling mechanism moves the parts to the cooling station where the parts are cooled to near ambient temperature. The cooled parts are then moved to the next sputtering station where the next metal layer is applied. This design permits the application of a sputtered layer thickness of approximately twice the attainable thickness of a conventional single cathode system. Adding additional cathodes and cooling stations permits the application of even thicker layers. Alternatively, if there is only one cathode and only one cooling station, thicker layers can be obtained by cycling between the cathode and the cooling station. In FIG. 7, a more complex configuration of the metalizer is shown where more cathodes and cooling stations are used to either add additional thickness or to deposit a secondary material such as a final protective layer. In this way, sputtering of a copper shielding layer and the deposition of a protective nickel layer to prevent oxidation of the copper can be effected. The result is the creation of a very high performance EMI/RFI shielding layer with protection from surface oxidation.

Moreover, with rapid cycle sputtering systems of the prior art, the ultimate layer thickness is limited by part temperature. In these prior art systems, the layer thickness is generally low (50 nm) and part heating is negligible. Such systems depend on the heat capacity of the substrate to limit the temperature rise of the part. However, with thicker layers, such a transient approach is not acceptable. Part temperature is raised at a rate where overheating occurs before the final thickness is obtained.

For proper operation of the incremental deposition approach described in the subject invention, there is typically an approximate balance between the energy deposited into the part during a sputtering cycle and the heat removed from the part during a cooling cycle. This is shown in FIG. 4 where the part temperature after cooling is approximately the same as the part temperature prior to the sputtering cycle. This feature is accomplished by controlling the temperature of the heat sink or the pressure of the cooling gas to control the heat transport rate during cooling. The design discussed herein is not limited to one sided sputtering, however. In some applications, such as optical lenses and other components, the deposition of a coating on both sides of the part may be required and this may be accomplished with opposing magnetrons, where sputtering occurs on both sides of the part simultaneously. Opposing cooling stations would then be used to remove heat from both sides of the part. Such a system would behave similarly to a single sided deposition system and the heat would be deposited into the part from both sides and removed from both sides in a balanced manner.

The sputtering cathode discussed above is a conventional magnetron but more sophisticated sputtering methods can be used for deposition of dielectric materials. Masking can be used to prevent deposition from undesirable areas.

Part cooling in a vacuum, as discussed above, is difficult since the prevalent modes of heat transfer are rendered ineffective. Conduction cooling is unreliable since intimate contact is necessary between the heat sink and the part being cooled. Such contact is not practical in a production system. Convective cooling is non-existent since no gas is available to transport heat. Radiation cooling rates are very low since part temperature, while hot for plastic, is not hot enough to initiate high radiation heat fluxes. The cooling system of the subject invention makes use of a cooling gas such as helium at low pressure to permit conduction between the part face and the heat sink very close to it. Helium has a high thermal conductivity at pressures as low as one Torr. This permits the venting of a small amount of helium into the cooling chamber to initiate heat conduction between the part face and the heat sink. Cooling rates from such a system are sufficient to return part temperatures to near ambient within a single cycle of the machine.

Accordingly, in this invention, the thermal damage, embrittlement, product waste, and the troubleshooting required when plastic parts where completely coated at once with a metalization layer are overcome by only partially coating the part and then, before thermal damage can occur, by moving the parts to a cooling station where they are actively and quickly cooled. The coating and active cooling steps are then repeated until the desired coating thickness is obtained. Thermal damage is avoided and yet the overall process faster than the prior art method when all the parts were completely coated during only one cooling step.

Figure 8:
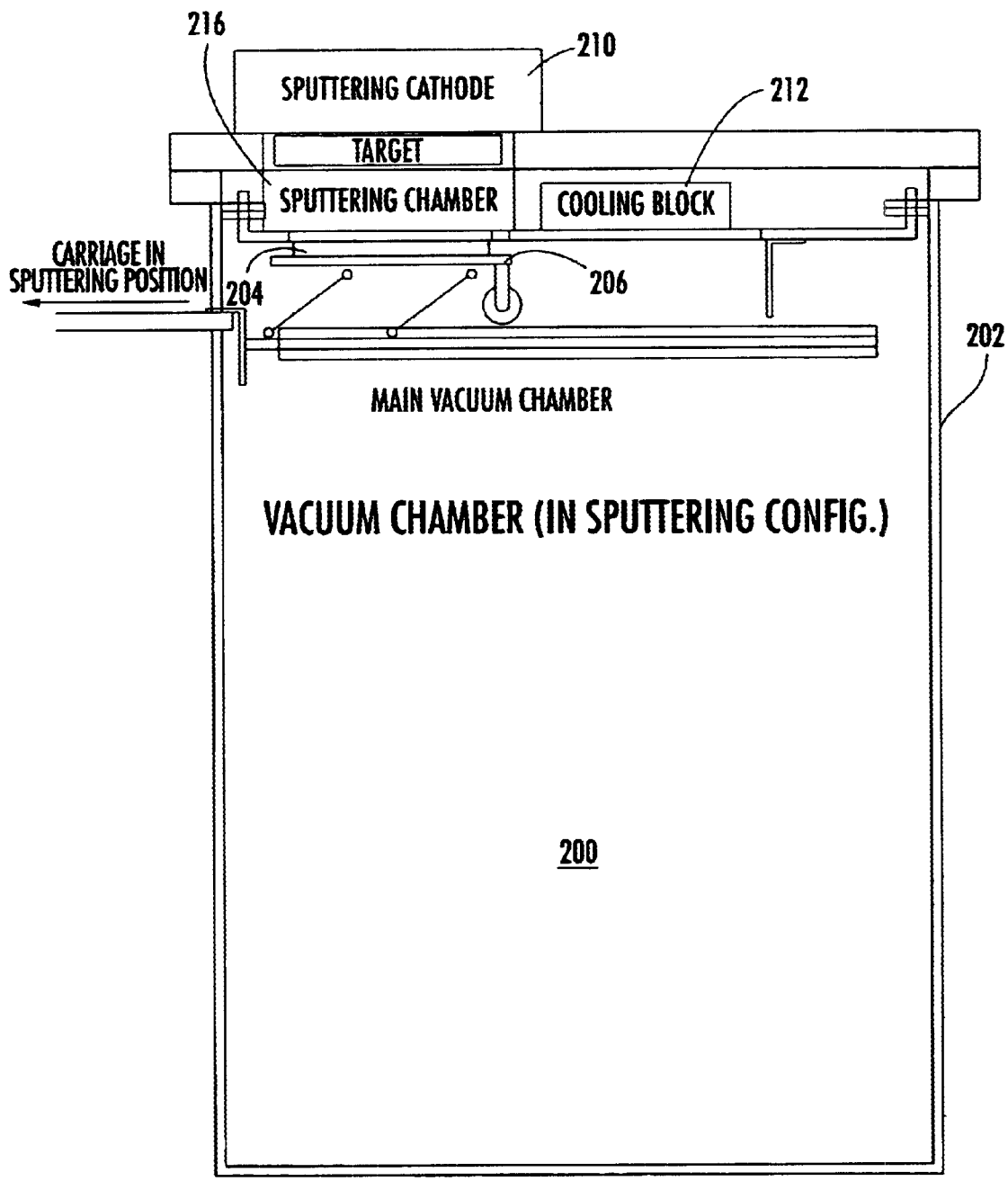
FIGS. 8 and 9 are schematic views of the laboratory set up used to evaluate the proposed system for applying a coating to an insulative component in accordance with the subject invention.
Figure 9:
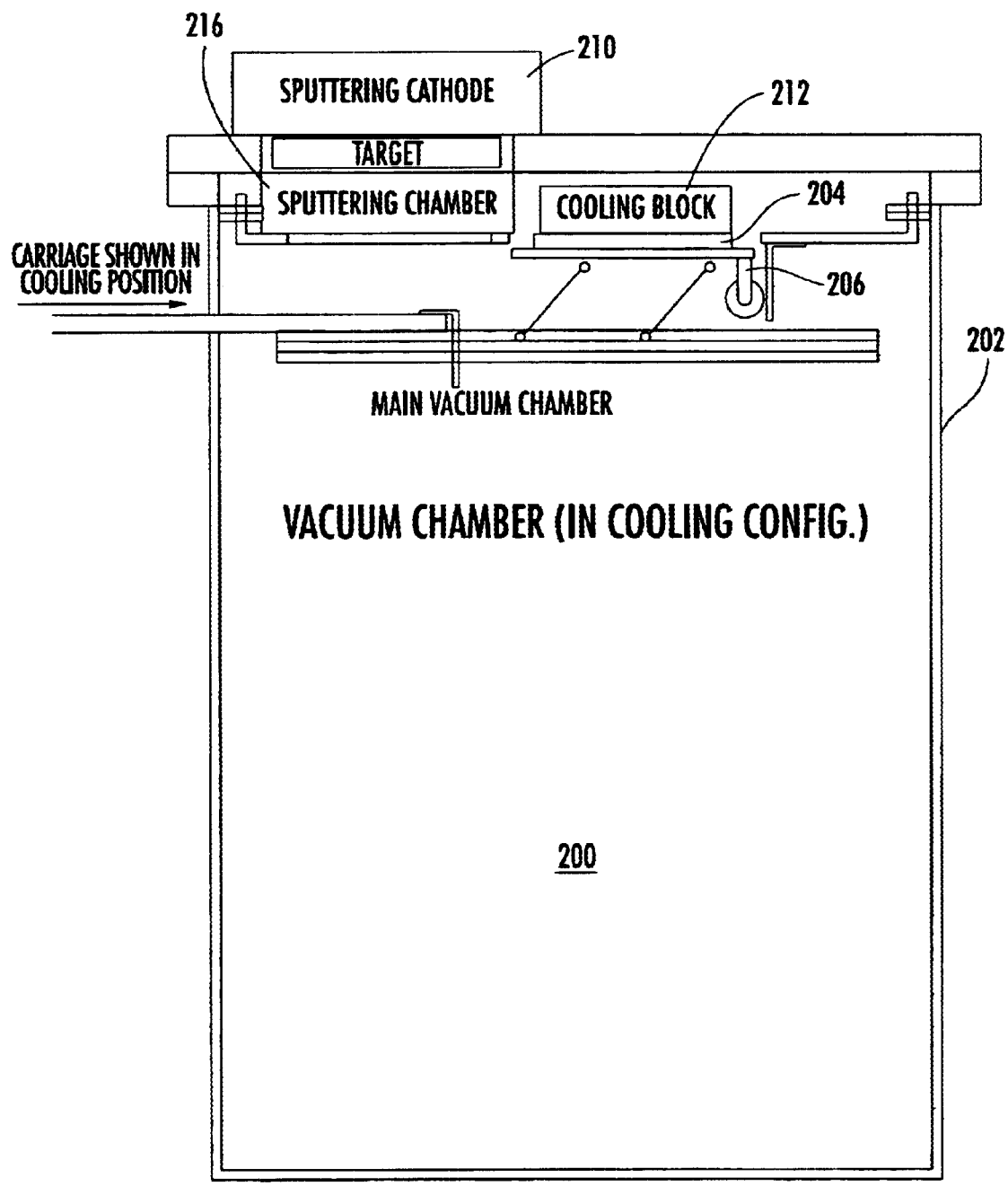

In the laboratory, parts were loaded into vacuum chamber 200 of metalizer 202, FIGS. 8–9 by venting the chamber to atmosphere and installing part 204 into the transport carriage 206. The part was held in position with a fixture. Chamber 200 was pumped down to a suitable vacuum level to remove air and water from the system (approximately $10^{-5}$ Torr). Argon was vented into the chamber and cathode 210 was fired for approximately 10 seconds. Carriage 206 was then pushed into the cooling position as shown in FIG. 9. This action pushed the part up to cooling block 212 at ambient temperature as shown. Helium was then vented into chamber 200 and the part was allowed to cool for approximately 20 seconds. Part 204 was then pulled back to the sputtering location 216 and the helium was pumped out. Argon was vented in and the next layer was sputtered. This process was continued until the desired layer thickness was attained. The sputtering rate was 40 nm/sec and the size of the cooling block was 1⅝"×5"×1¼".

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method of applying a coating to an insulative substrate, the method comprising:

applying a coating material to the insulative substrate by physical vapor deposition to form a partial layer of coating material having a predetermined thickness;

before overheating and thermal damage to the insulative substrate can occur, moving the partially coated substrate proximate an active cooling station device to drive the temperature of the insulative substrate substantially down; and repeating the above coating and cooling steps until the desired total coating thickness is obtained to avoid thermal damage to the substrate.

2. The method of claim 1 in which the coating material is metal and the same material is applied during all coating steps.

3. The method of claim 2 in which the metal includes copper, aluminum and alloys of the same.

4. The method of claim 1 in which the coating material is a polycrystalline substance.

5. The method of claim 1 in which the substrate is plastic.

6. The method of claim 5 in which the substrate is between 1–4 mm thick.

7. The method of claim 1 in which the coating is applied to a total thickness N, there are X coating steps, and, at each coating step, a thickness of N/X is applied.

8. The method of claim 7 in which N is between 2 to 4 microns and N/X is between 1/8 and 5/8 micron.

9. The method of claim 1 in which the insulative substrate is the housing of an electronic device.

10. The method of claim 9 in which the housing is a cellular telephone housing.

11. The method of claim 1 in which the insulative substrate is a plastic lens.

12. The method of claim 1 in which physical vapor deposition includes sputtering, cathodic arc deposition, and evaporation techniques.

13. The method of claim 1 in which cooling includes placing the partially coated substrate proximate a heat sink and subjecting the partially coated substrate to a high conductivity gas.

14. The method of claim 13 in which the high conductivity gas is helium.

15. The method of claim 13 in which the heat sink is cooled by a liquid coolant.

16. The method of claim 1 in which each coating step lasts less than one minute.

17. The method of claim 1 in which each cooling step lasts less than one minute.

18. The method of claim 1 in which the time span in which each partial layer of coating material is applied is the same or approximately the same time span for each cooling step.

19. The method of claim 1 in which the substrate temperature never exceeds 60° C.

20. The method of claim 1 in which the substrate temperature never exceeds 90° C.

21. The method of claim 1 in which cooling drives t he temperature of the substrate from between 40–60° C. to between 5–20° C.

* * * * *